United States Patent [19]

Hashimoto

[11] Patent Number: 5,333,413
[45] Date of Patent: Aug. 2, 1994

[54] AUTOMATIC WAFER LAPPING APPARATUS

[75] Inventor: Hiromasa Hashimoto, Fukushima, Japan

[73] Assignee: Shin-Etsu Handotai Co., Ltd., Tokyo, Japan

[21] Appl. No.: 991,797

[22] Filed: Dec. 15, 1992

[30] Foreign Application Priority Data

Dec. 18, 1991 [JP] Japan .................. 3-353129

[51] Int. Cl.⁵ .......................... B24B 7/04; B24B 7/22
[52] U.S. Cl. ..................... 51/165.75; 51/132;
51/215 CP; 51/215 UE; 51/131.3; 51/117; 51/118
[58] Field of Search ............... 51/131.1, 131.2, 131.3, 51/131.4, 131.5, 132, 215 CP, 215 H, 215 UE, 165.75, 281 R, 283 R, 281 SF, 11 R, 117, 118

[56] References Cited

U.S. PATENT DOCUMENTS

| | | | |
|---|---|---|---|
| 4,002,246 | 1/1977 | Brandt et al. | 51/215 CP |
| 4,593,495 | 6/1986 | Kawakami et al. | 51/118 |
| 4,856,232 | 8/1989 | Shirai | 51/215 CP |
| 4,916,868 | 4/1990 | Wittstock | 51/118 |
| 5,174,067 | 12/1992 | Hasegawa et al. | 51/215 UE |

FOREIGN PATENT DOCUMENTS

| | | | |
|---|---|---|---|
| 187447 | 10/1984 | Japan | 51/118 |
| 38857 | 2/1986 | Japan | 51/131.4 |
| 203264 | 9/1986 | Japan | 51/131.4 |
| 136366 | 6/1987 | Japan | 51/131.4 |
| 19166 | 3/1989 | Japan. | |

Primary Examiner—Jack Lavinder
Attorney, Agent, or Firm—Lowe, Price, LeBlanc & Becker

[57] ABSTRACT

An automatic wafer lapping apparatus including: a lapping assembly consisting of an upper lapping plate, a lower lapping plate and wafer carriers; a loader assembly installed in the vicinity of the lapping assembly; an unloader assembly installed in the vicinity of the lapping assembly; and a robot having wafer holder member for holding a plurality of wafers and for transferring the wafers between the loader assembly and the unloader assembly and the lapping assembly, WHEREIN the wafer lapping assembly further includes a position sensor for detecting the position of the carriers and a device for cleaning the wafer holder, and the robot consists of a single-handed arm and the wafer holder supported at the fore end of the arm of the robot which can hold wafers one by one.

2 Claims, 2 Drawing Sheets

AUTOMATIC WAFER LAPPING APPARATUS

BACKGROUND OF THE INVENTION

The present invention relates an automatic wafer lapping apparatus for automatically lapping the surfaces of wafers such as a semiconductor wafer.

PRIOR ART

In the semiconductor manufacturing industry, a semiconductor wafer is obtained from a single crystal ingot, such as one grown of molten polycrystal silicon, by slicing the ingot into thin discs, which are then lapped, etched and given other finishing treatments.

Of these treatments the lapping treatment of the semiconductor wafers is effected by means of a wafer lapping apparatus. Conventionally, a typical automatic wafer lapping apparatus comprises a lapping assembly consisting of an upper lapping plate, a lower lapping plate and a set of planetary gears (hereinafter merely referred to as "carriers" for they carry wafers in them), a wafer loader assembly and a wafer unloader assembly both arranged in the vicinity of the lapping assembly, and a swing arm robot for picking wafers from the loader assembly and setting the wafers in and removing the same from the carriers and eventually turning the wafers in the unloader assembly.

The lower lapping plate is equipped with a sun gear (drive gear) in the center and an internal gear along the circumference of the lower lapping plate. The carriers are set on the lower lapping plate in a manner such that they are in mesh with both the sun gear and the internal gear. Bores shaped and sized exactly like the wafers are made through each carrier, and as many wafers as the bores are fitted therein in each carrier.

In such an automatic wafer lapping apparatus, the wafers housed in the loader assembly are picked up one after another by the robot by means of vacuum suction, and are brought to the carriers and are fitted in the circular bores of the carriers. After the upper lapping plate is placed on the lower lapping plate, the the sun gear is driven to rotate whereby the carriers are caused to undergo a planetary movement around the sun gear between the upper and lower lapping plates, which are being turned in opposite directions; thus, the upper faces of the wafers are ground and polished with polishing slurry. The lapped wafers are then removed from the carriers by the robot are brought to and housed in the unloader assembly. In this way a series of lapping treatment is completed.

PROBLEMS THE INVENTION SEEKS TO SOLVE

In a conventional automatic wafer lapping apparatus [e.g., one disclosed in Japanese Utility Model Application Kokoku 1-9166 (1989)], a predetermined number of wafers were held and brought by a swing arm robot to the carriers, and wafers were set in the circular bores made through each carrier all at once. It was, therefore, necessary to detect the center of each carrier by the robot when the wafers were set in the carriers or when the wafers were removed from the carriers; however, it took a considerable time before the robot could locate the center of a carrier halted at an arbitrary position, and this made it difficult to improve the production efficiency.

Also, in the conventional apparatus, a plurality of swing arm robots corresponding to the respective carriers were installed around the wafer lapping apparatus so that the apparatus tended to be bulky and required a vast installation space.

Furthermore, in the conventional automatic wafer lapping apparatus, there was not provided a means for removing the residues such as the slurry sticking to the wafer suction assembly of the robot; consequently, the wafers were damaged by the residues and the rate of occurrence of off-specification wafers was not low.

The present invention was contrived in view of these problems, and it is, therefore, an object of the invention to provide an automatic wafer lapping apparatus which can improve the production efficiency, save installation space, and lower the occurrence of off-specification.

MEANS TO SOLVE THE PROBLEMS

Therefore, there is provided an automatic wafer lapping apparatus including: a lapping assembly consisting of an upper lapping plate, a lower lapping plate and wafer carriers; a loader assembly installed in the vicinity of the assembly; an unloader assembly installed in the vicinity of the lapping assembly; and a robot having wafer holder means for holding a plurality of wafers and for transferring the wafers between the loader assembly and the unloader assembly and the lapping assembly;

the wafer lapping apparatus being characterized by that the lapping assembly further includes a position sensor means for detecting the position of the carriers and a means for cleaning the wafer holder means, and that the robot consists of a single-handed arm and the wafer holder means supported at the fore end of the arm of the robot which can hold wafers one by one.

In a preferred embodiment, the position sensor is connected to the fore end of a reciprocative rod of a cylinder means installed in the vicinity of the periphery of the lower lapping plate of the lapping assembly, the rod being disposed to reciprocate radially of the lapping plates.

Furthermore, the wafer holder means comprises: a rotatory disk plate capable of rotating freely and having a plurality of wafer chucks arranged along the circumference of the disk plate equiangularly about the center thereof; a sensor provided in the vicinity of the wafer chucks for detecting the angular phase of the carrier assuming a particular position; and a sensor also provided in the vicinity of the wafer chucks for detecting the center of the carrier.

EFFECTS OF THE INVENTION

According to the invention, the position of the carriers is detected by the position sensor installed in the lapping apparatus, and after lapping operation the carriers are always halted at the same angular phase position by virtue of the position sensor so that rough positioning of the carriers are always effected, and the time required for the alignment by the single-arm robot is short and the production efficiency is much improved.

Also, according to the invention, there is installed only one robot, so that the lapping apparatus 1 can be compact in size and the space taken by the automatic wafer lapping apparatus can be much smaller than the conventional apparatuses.

Furthermore, after the lapping operation, since the residues such as slurry sticking to the wafer chucks 27 of the robot D are removed by means of the cleaning apparatus 33, the wafers are safe from being damaged and consequently the occurrence of off-specification wafers is lowered.

EMBODIMENTS

Next, An embodiment of the present invention will be described with reference to the attached drawings.

Figure 1:
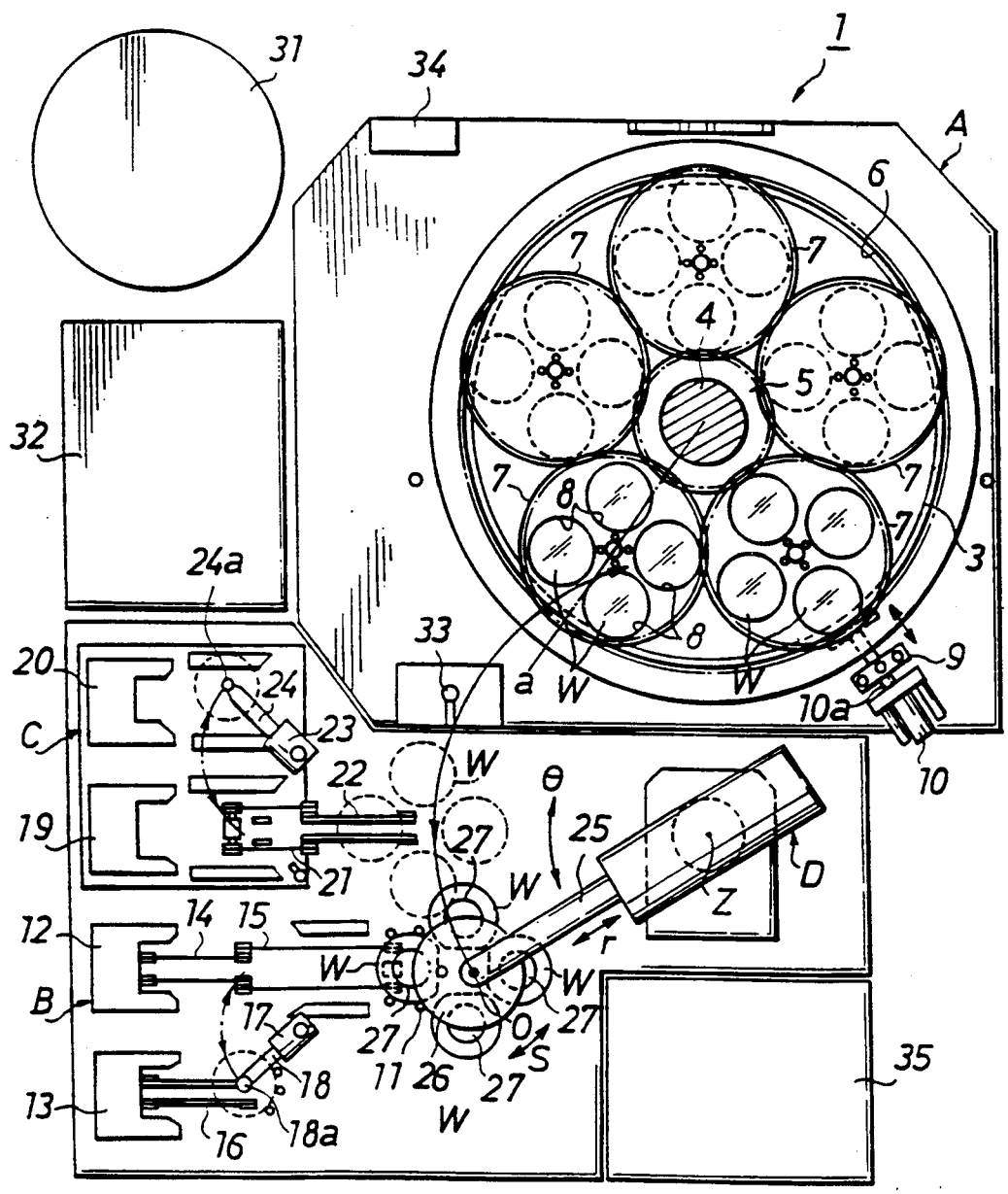
FIG. 1 is a top plan view of an automatic wafer lapping apparatus according to the invention.
Figure 2:
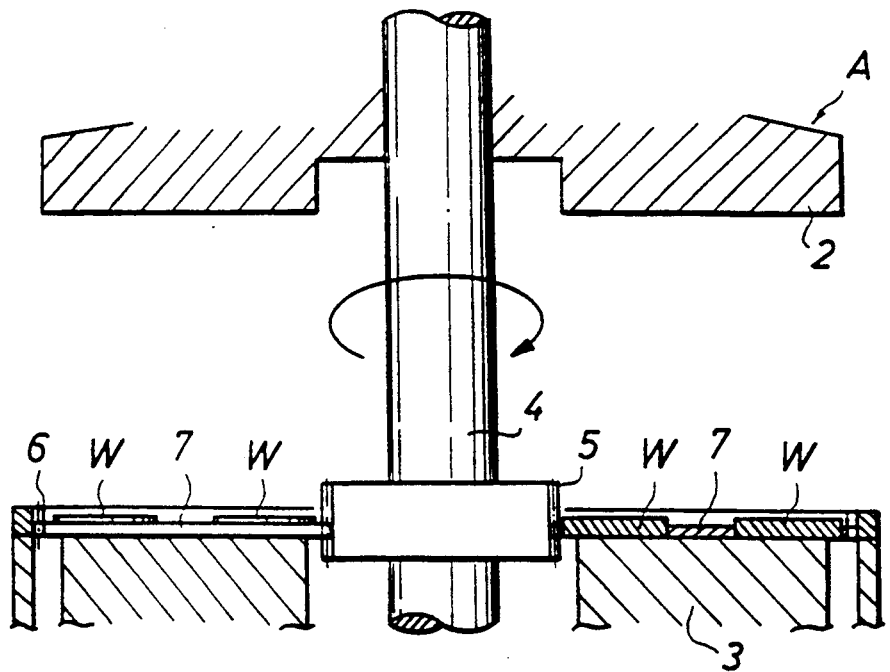
FIG. 2. is a vertical cross section of the main body of the lapping assembly.
Figure 3:
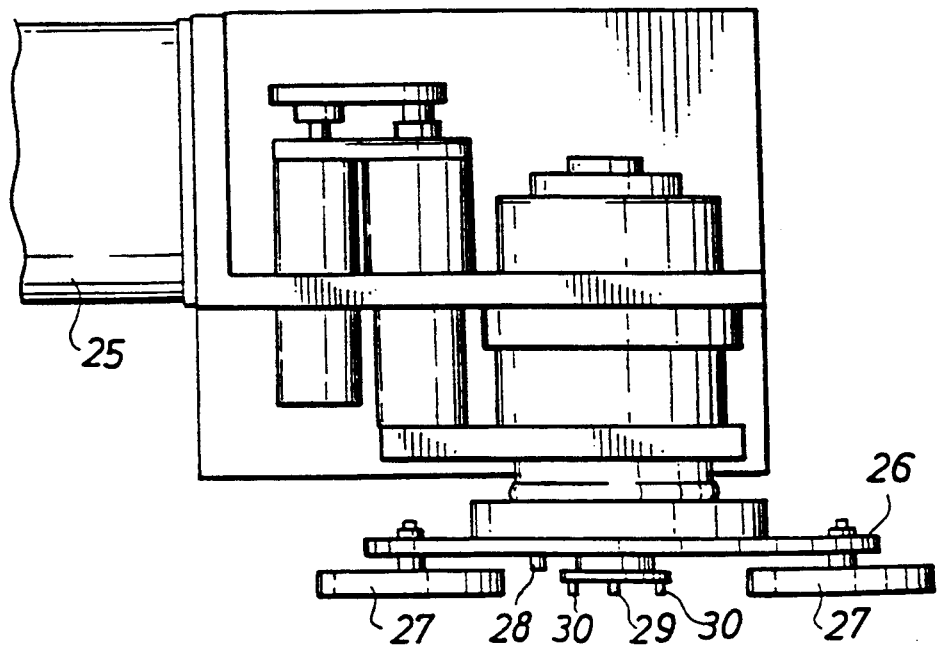
FIG. 3 is a side view of the suction assembly of a swing arm robot.

FIG. 1 is a top plan view of an automatic wafer lapping apparatus according to the present invention; FIG. 2 is a vertical cross section of the main body of the lapping assembly; and FIG. 3 is a side view of the suction assembly of a swing arm robot.

As shown in FIG. 1, the automatic wafer lapping apparatus 1 of the present invention comprises of a lapping assembly A, a wafer loader assembly B which is arranged in the vicinity of the lapping assembly A, a wafer unloader assembly C, and a single-handed swing arm robot D.

The lapping assembly A, as shown in FIG. 2, has an upper lapping plate 2 and a lower lapping plate 3, the former being capable of sliding vertically along a vertical rotatory shaft 4 and capable of turning about the same shaft 4 freely. A sun gear 5 which constitutes the drive gear is locked about the lower end portion of the shaft 4 and lies in the center of the lower lapping plate 3, and an internal gear 6 is provided along the circumference of the lower lapping plate 3.

As shown in FIG. 1, five carriers 7, which are planetary gears, are meshed both with the sun gear 5 and the internal gear 6 and are set between the sun gear 5 and the internal gear 6. Each carrier 7 has four circular bores 8 having the diameter as the wafers W so as to hold the wafers W therein and are positioned such that the centers of the circular bores 8 form a square of which the center coincides with the center of the carrier 7.

Now, as shown in FIG. 1, in the vicinity of the outer periphery of the lower lapping plate 3 of the lapping assembly A is provided a position sensor 9 for detecting the position of a carrier 7. This position sensor 9 is connected at the fore end of a rod 10a of an air cylinder 10, and is capable of shifting radially of the lower lapping plate 3 from the position indicated in solid line to the position indicated in broken line in FIG. 1.

The wafer loader assembly B comprises a pair of cassettes 12, 13 laid in parallel with each other, in which wafers W to be lapped are piled up in the vertical direction (i.e., perpendicular to the sheet of FIG. 1). Conveyor means 14 and 15 are laid to extend from the open gate of the cassette 12 toward a place to which the single-handed arm robot D can swing its hand; also, a conveyor means 16 is laid to extend from the open gate of the cassette 13 in parallel with the conveyor means 14 and 15. Incidentally, at the end of the transportation means 15 is provided a set of stopper means 11 for positioning a wafer W.

Also the wafer loader assembly B includes a wafer transferrer 17, whose arm 18 has a vacuum sucker 18a at the fore end.

Similarly, the wafer unloader assembly C comprises a pair of cassettes 19 and 20 laid in parallel with each other for housing the wafers W after they are lapped. Conveyor means 21 and 22 are placed in front of the open gate of the cassette 19. Also this wafer unloader assembly C includes a wafer transferrer 23, whose arm 24 has a vacuum sucker 24a at the fore end.

The robot D is pivotally mounted on the base in common with the assemblies B and C so that it can swing horizontally about a vertical axis z; the robot D can also shift vertically along the axis z; furthermore, the robot D has a horizontally extending arm 25, which can slide forward and backward. Consequently, the arm 25 can reach an arbitrary point in a cylindrical coordinate (r, $\theta$, Z). A horizontal disk plate 26 is pivotally connected at and underneath the fore end of the arm 25 so that the disk plate 26 can freely turn circumferentially about a vertical axis 0. Four wafer chucks 27 are provided in a row evenly along the circumference of the disk plate 26 (i.e., at 90° angular pitch), and, as shown in FIG. 3, in the vicinity of the middle of the lower face of the disk plate 26 is provided a sensor 28 for aligning the angular phase of the carrier 7; also provided in the vicinity are a pair each of sensors 29 and sensors 30, each pair being arranged diagonally. The sensors 29, 30 are for locating the center of the carrier 7. In particular, the sensors 29 are for detecting the position of the carrier center in terms of r, and the sensors 30 are for locating the center in terms of $\theta$.

Besides the elements described above, the automatic wafer lapping apparatus 1 of the present invention further includes a slurry tank 31, a vacuum pump 32, a cleaning apparatus 33 for applying cleaning liquid to the chucks 27 of the robot D to thereby clean them, operation panels 34, 35, etc. (ref. FIG. 1). As shown, the cleaning apparatus 33 is located at a suitable position by which the wafer chucks 27 of the robot D pass the robot D swings about the axis Z.

Next, the operation of the automatic wafer lapping apparatus 1 will be described.

As shown in FIG. 1, five carriers 7 are set on the lower lapping plate 3 to mesh between the sun gear 5 and the internal gear 6. Twenty wafers W are fitted in the circular bores 8 of the five carriers 7. When, the upper lapping plate 2 is lowered along the vertical rotatory shaft 4 upon the lower lapping plate 3, the five carriers 7 and the twenty wafers W held therein are sort of sandwiched between the lapping plates 2, 3 of the lapping assembly A. Then, the rotatory shaft 4 together with the sun gear 5 is driven to rotate whereupon the carriers 7 start revolving both round the sun gear 5 and about their respective centers. Thus, the upper and lower faces of the wafers W are lapped with the polishing slurry by the lapping faces of the upper and lower lapping plates 2, 3.

When the wafers W are thus lapped, the upper lapping plate 2 is raised along the rotatory shaft 4, and the air cylinder 10 is driven in a manner such that the position sensor 9 is pushed out toward the moving carriers 7 to assume a position indicated in broken line in FIG. 1, and the phase position of the carriers 7 is detected by means of this position sensor 9. When the position sensor 9 detects that the carriers 7 assume a predetermined phase position, the sun gear 5 and the internal gear 6 are caused to stop driving, and the carriers are stopped at the predetermined phase position and thus a rough positioning of the carriers is effected.

Next, the robot D is driven in a manner such that the arm 25 swings in the angular direction $\theta$ until the wafer suction assembly comprising the wafer chucks 27 provided at the fore end of the arm 25 comes to a position exactly above a carrier 7 which is assuming the position a, shown in FIG. 1; then the phase angle of the carrier is detected by the sensor 28 and, simultaneously as this, the position of the center of the carrier 7 is detected by means of the sensors 29, 30; then, responsive to the results of these detection, the arm 25 is moved in the directions of r and θ whereby the wafer suction assembly is positioned such that the center of the suction assembly coincides with the center of the carrier 7 with high precision. Then, the arm 25 is lowered along the axis Z and the four wafers W carried by the carrier 7 are sucked and held by the wafer chuck 27; next, the arm 25 is raised along the axis Z and the arm 25 is swung back in the angular direction θ until the wafer suction assembly comes over the wafer unloader assembly C, whereupon the wafers W held by the wafer suction assembly assume the positions indicated in broken line in FIG. 1.

The wafer W held over the conveyor means 22 is dropped on the conveyor means 22, which conveys the wafer W into the cassette 19, and then the disk plate 26 is turned by an angle of 90° so that the next wafer W comes over the conveyor means 22, and by repeating the procedure already described the remaining wafers W held by the wafer suction assembly are one after another placed on the conveyor means 22 and brought into the cassette 19. Incidentally, when the cassette 19 becomes fully occupied with the wafers, the new-coming wafers are transferred by the wafer transferrer 23 from the conveyor means 21 to the front of the cassette 20 and therein housed.

While the four lapped wafers W are thus housed in the cassette 19 (20) of the wafer unloader assembly C, the lower lapping plate 3 is turned by 72° and a new carrier 7 comes to assume the position a of FIG. 1; then again the robot D is driven and the wafer suction assembly comes over the carrier 7 which is assuming the position a, and the same operation as above is conducted on the four wafers in the carrier 7; thereafter, in the same manner, all remaining carriers 7 on the lower lapping plate 3 are exhausted of the wafers, and eventually all of the twenty lapped wafers W carried in the carriers 7 are housed in the wafer cassettes 19 and 20.

When one batch of (twenty) wafers W are thus housed in the cassettes 19 and 20 of the unloader assembly C, water is ejected from the cleaning apparatus 33 to flush the wafer chucks 27 of the robot D to wash off the residues such as slurry. Then, next twenty wafers W are taken out from the cassette 12 and/or 13 of the loader assembly B and brought to the lapping assembly A where they are lapped.

First, the wafers W in the cassette 12 of the loader assembly B are conveyed one by one on the conveyor means 14 and 15 until they are stopped by the stopper means 11, by which each wafer W is oriented such that the orientation flat looks forward, as shown in FIG. 1.

This wafer W is sucked up by that wafer chuck 27 of the wafer suction assembly of the robot D which is waiting immediately above it. The next wafer W is then brought by the conveyor means 14, 15 to the stopper means 11 and similarly oriented. As the disk plate 26 is turned by 90° each time a wafer W is sucked by a wafer chuck 27, the wafer chucks take turns to suck and pick up the wafers W one by one. So, the next chuck picks up the second wafer W. When four wafers W are held by the four wafer chucks 27 in this way, the swing arm robot D is caused to turn round and bring the wafers W to the lapping assembly A and load that carrier 7 with the four wafers at a time which is assuming the position a in FIG. 1. The wafers W are thus fitted in the bores 8 of the carriers 7. This procedure is repeated until all of the carriers 7 are filled up with wafers W. When the cassette 12 is exhausted of the wafers W, the conveyor means 16 starts bringing out the wafers W from the cassette 13, and the wafer transferrer 17 transfers the wafers W one by one to the conveyor means 15. Eventually, twenty wafers W are set in the carriers 7, and in the manner described earlier the wafers W are lapped.

In this embodiment, the phase angle of the carriers 7 is detected by the position sensor 9 installed in the lapping assembly A, and it is arranged such that the carriers 7 are always halted at predetermined phase angle after lapping operation so that a rough positioning of the carriers 7 is effected then, and as the result, the time required for the robot D to align itself with the carrier 7 at the position a is short and, as such, the production efficiency is improved.

Also, since in the automatic wafer lapping apparatus 1 according to the invention, there is installed only one robot D, so that the apparatus 1 can be compact in size and the space taken by the apparatus 1 can be much smaller than the conventional apparatuses.

Furthermore, after the lapping operation, since the residues such as slurry sticking to the wafer chucks 27 of the robot D are removed by means of the cleaning apparatus 33, the wafers are safe from being damaged and consequently the the occurrence of off-specification wafers is lowered.

Obviously many modifications and variations of the present invention are possible in the light of the above teachings. It is therefore to be understood that within the scope of the appended claims the invention may be practiced otherwise than is specifically described.

What is claimed is:

1. An automatic wafer lapping apparatus comprising:
   a lapping assembly consisting of an upper lapping plate, a lower lapping plate and wafer carriers,
   a loader assembly provided adjacent to said lapping assembly,
   an unloader assembly provided adjacent to said lapping assembly, and
   a robot having wafer holder means for holding a plurality of wafers and for transferring the wafers between the loader assembly and the unloader assembly and the lapping assembly,
   said lapping assembly further includes a position sensor means for detecting the position of the carriers and a means for cleaning the wafer holder means, said robot consists of a single arm member with the wafer holder means being supported at a free end of said single arm member of the robot, said wafer holder means including means to selectively and individually hold a plurality of wafers wherein said wafer holder means comprises: a rotary disk plate capable of rotating and having a plurality of wafer chucks arranged along a circumference of the disk plate equiangularly about the center thereof; a sensor provided in said rotary disk plate adjacent to said wafer chucks for detecting an angular phase of one of said carriers; and a pair of sensors provided in said rotary disk plate adjacent to said wafer chucks for detecting the center of said one carrier.

2. The automatic wafer lapping apparatus as claimed in claim 1, wherein said position sensor is connected to a free end of a reciprocative rod which is actuated by a cylinder means provided adjacent to a periphery of the lower lapping plate of the lapping assembly, said rod being disposed to reciprocate radially with respect to the upper and lower lapping plates.

* * * * *